US009214625B2

(12) United States Patent
Annunziata et al.

(10) Patent No.: US 9,214,625 B2
(45) Date of Patent: Dec. 15, 2015

(54) THERMALLY ASSISTED MRAM WITH INCREASED BREAKDOWN VOLTAGE USING A DOUBLE TUNNEL BARRIER

(71) Applicant: International Business Machines Corporation, Armonk, NY (US)

(72) Inventors: Anthony J. Annunziata, Stamford, CT (US); Philip L. Trouilloud, Norwood, NJ (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/217,999

(22) Filed: Mar. 18, 2014

(65) Prior Publication Data

US 2015/0270478 A1    Sep. 24, 2015

(51) Int. Cl.
*H01L 29/82* (2006.01)
*H01L 43/02* (2006.01)
*H01L 43/12* (2006.01)

(52) U.S. Cl.
CPC .............. *H01L 43/02* (2013.01); *H01L 43/12* (2013.01)

(58) Field of Classification Search
USPC ........................................................ 257/421
See application file for complete search history.

(56) References Cited

U.S. PATENT DOCUMENTS

| 6,385,082 | B1 | 5/2002 | Abraham et al. | |
|---|---|---|---|---|
| 7,411,817 | B2 | 8/2008 | Nozieres et al. | |
| 7,443,639 | B2 | 10/2008 | Parkin | |
| 7,598,555 | B1 | 10/2009 | Parkin | |
| 7,796,428 | B2 | 9/2010 | Redon | |
| 7,957,181 | B2 | 6/2011 | Nozieres et al. | |
| 2012/0106245 | A1 | 5/2012 | Mackay et al. | |
| 2012/0120720 | A1 | 5/2012 | Cambou | |
| 2013/0082339 | A1* | 4/2013 | Aggarwal et al. | 257/421 |
| 2013/0221460 | A1* | 8/2013 | Jan et al. | 257/421 |

OTHER PUBLICATIONS

R. Ferreira, et al., "Dynamic Thermomagnetic Writing in Tunnel Juntion Cells Incorporating Two GeSbTe Thermal Barriers," IEEE Transactions on Magnetics, vol. 42, No. 2006, pp. 2718-2720.
J. Wang, et al., "Low-Current Blocking Temperature Writing of Double Barrier Magnetic Random Access Memory Cells," Appl. Phys. Lett., vol. 84, 2004, pp. 945-947.

* cited by examiner

*Primary Examiner* — Shaun Campbell
(74) *Attorney, Agent, or Firm* — Cantor Colburn LLP; Vazken Alexanian

(57) ABSTRACT

A mechanism is provided for a thermally assisted magnetoresistive random access memory device (TAS-MRAM). A non-magnetic heating structure is formed of a barrier seed layer disposed on a buffer layer. A non-magnetic tunnel barrier is disposed on the barrier seed layer. A barrier cap layer is disposed on the non-magnetic tunnel barrier. A top buffer layer is disposed on the barrier cap layer. An antiferromagnetic layer is disposed on the top buffer layer of the non-magnetic heating structure. A magnetic tunnel junction is disposed on the antiferromagnetic layer. The magnetic tunnel junction includes a ferromagnetic storage layer disposed on the antiferromagnetic layer, a non-magnetic active tunnel barrier disposed on the ferromagnetic storage layer, and a ferromagnetic sense layer disposed on the non-magnetic active tunnel barrier.

20 Claims, 3 Drawing Sheets

THERMALLY ASSISTED MRAM WITH INCREASED BREAKDOWN VOLTAGE USING A DOUBLE TUNNEL BARRIER

BACKGROUND

The present invention relates generally to magnetic memory devices, and more specifically, to thermally assisted MRAM devices that provide increased breakdown voltage using a double tunnel barrier.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic moment, separated by a thin insulating layer. In a typical embodiment, one of the two plates is a reference magnet with magnetization set to a particular polarity; the other plate's magnetization can be changed to match that of an external field to store memory and is termed the "free magnet" or "free-layer". This configuration is known as a magnetic tunnel junction and is the simplest structure for a MRAM bit. A memory device is built from a grid of such "cells." In some configurations of MRAM, such as the type further discussed herein, both the reference and free layers of the magnetic tunnel junctions can be switched using an external magnetic field.

SUMMARY

According to one embodiment, a thermally assisted magnetoresistive random access memory device (TAS-MRAM) is provided. The device includes a non-magnetic heating structure. The non-magnetic heating structure is formed of a barrier seed layer disposed on a buffer layer, a non-magnetic tunnel barrier disposed on the barrier seed layer, a barrier cap layer disposed on the non-magnetic tunnel barrier, and a top buffer layer disposed on the barrier cap layer. An antiferromagnetic layer is disposed on the top buffer layer of the non-magnetic heating structure. A magnetic tunnel junction is disposed on the antiferromagnetic layer. The magnetic tunnel junction includes a ferromagnetic storage layer disposed on the antiferromagnetic layer, a non-magnetic active tunnel barrier disposed on the ferromagnetic storage layer, and a ferromagnetic sense layer disposed on the non-magnetic active tunnel barrier.

According to one embodiment, a method of forming a thermally assisted magnetoresistive random access memory device (TAS-MRAM) is provided. The method includes forming a non-magnetic heating structure. The non-magnetic heating structure is formed of a barrier seed layer disposed on a buffer layer, a non-magnetic tunnel barrier disposed on the barrier seed layer, a barrier cap layer disposed on the non-magnetic tunnel barrier, and a top buffer layer disposed on the barrier cap layer. An antiferromagnetic layer is disposed on the top buffer layer of the non-magnetic heating structure. A magnetic tunnel junction is disposed on the antiferromagnetic layer. The magnetic tunnel junction includes a ferromagnetic storage layer disposed on the antiferromagnetic layer, a non-magnetic active tunnel barrier disposed on the ferromagnetic storage layer, and a ferromagnetic sense layer disposed on the non-magnetic active tunnel barrier.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Thermally-assisted magnetoresistive random access memory (TAS-MRAM) entails heating of the magnetic tunnel junction stack to a write temperature ($T_{write}$) higher than the maximum storage temperature ($T_{store}$) in order to write to the device. The device consists of a storage magnetic layer, and a sense magnetic layer, separated by a non-magnetic tunnel barrier. The electrical resistance of this stack depends on the relative magnetic orientation of the parts of the storage and sense layers that interface with the tunnel barrier; this effect is caused by the phenomenon of tunneling magnetoresistance (TMR). In typical devices, an antiferromagnetic layer pins the storage layer at temperatures $T_{MRAM} < T_{store}$, where $T_{MRAM}$ is defined as the temperature of the magnetic tunnel junction and antiferromagnetic layers. The sense magnetic layer is free to toggle back and forth by an applied field. If the magnetic orientation of the sense layer is parallel to the magnetic orientation of the storage layer, then the MTJ stack will have low resistance; if the sense layer is anti-parallel to the storage layer, the stack will have high resistance. The device is read out by toggling the sense layer in both directions by an applied field of two known directions, and determining the direction of the storage layer based on the resistance change.

The MRAM device is written when the temperature of the MRAM device is $T_{MRAM} \geq T_{write}$; in this case, the pinning by the antiferromagnet is reduced and the storage layer can be re-oriented into a new direction by an applied field of known direction. One direction is chosen as a logical "1" state, while the other is chosen as a logical "0" state.

The storage layer may consist of a single magnetic layer, or a synthetic antiferromagnetic layer; each of these magnetic layers may in turn consist of several distinct, alloy, or compound materials and material layers.

In order to write the device into a logical "1" or "0" state, a heating (write) current is passed through the device in order to raise $T_{MTRAM} > T_{write}$. The magnitude of this heating voltage typically needs to be much larger than the read/sense voltage. If this heating voltage is too large, then the tunnel barrier may break down, and the device will be rendered inoperable. Although structures and methods to reduce the write voltage by reducing the thermal conductivity (and therefore increasing the heating efficiency) are typically implemented, these are often not enough to ensure reliable device operation, especially for devices that have high retention temperature ($T_{store}$) and therefore consequentially higher $T_{write}$.

Figure 1:
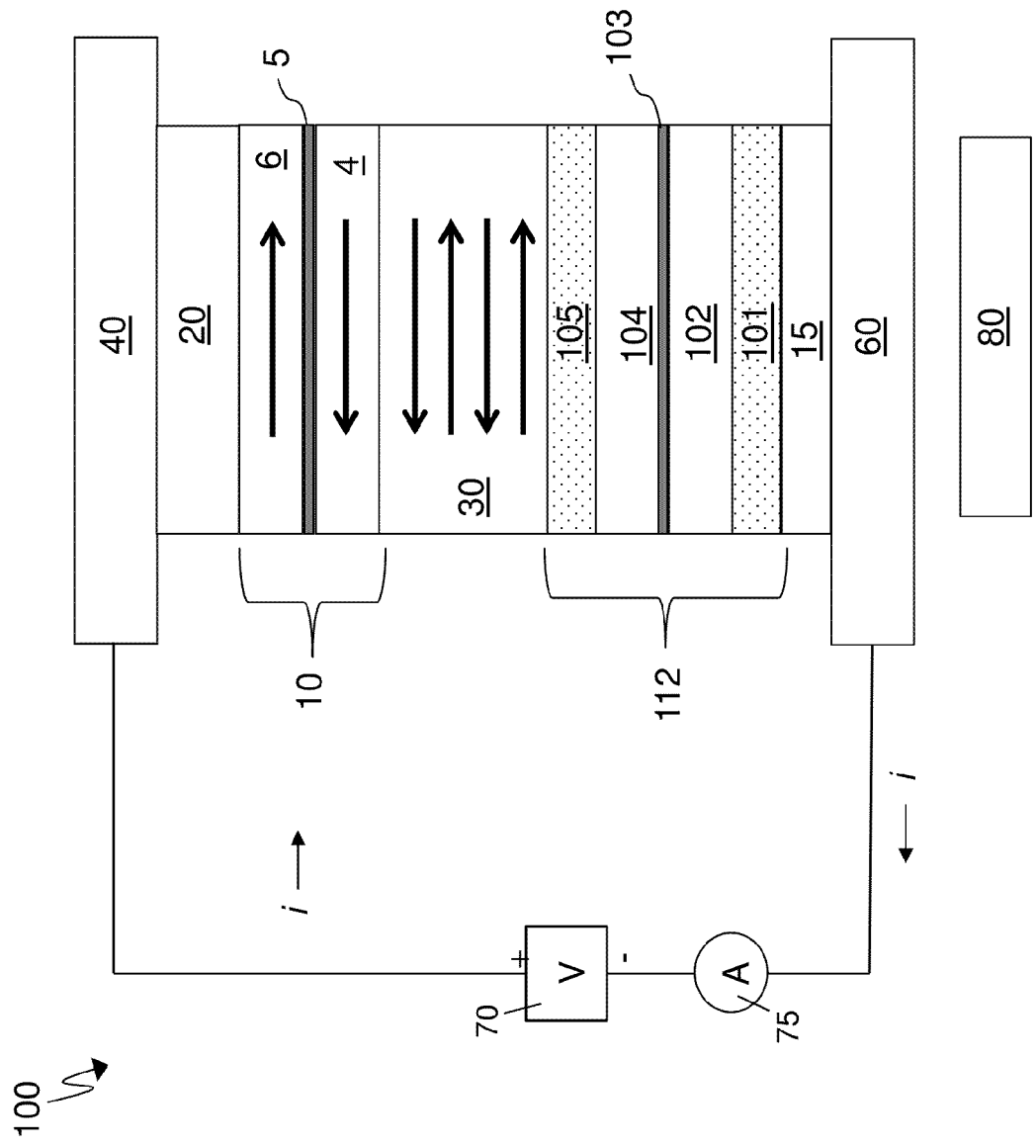
FIG. 1 is a cross-sectional view of a thermally-assisted magnetoresistive random access memory (TAS-MRAM) device according to an embodiment.

To make the MRAM device (more) reliable, an embodiment describes a structure that includes a second tunnel barrier, whose purpose includes providing a source of resistive heating, in addition to the first tunnel barrier in the magnetic stack. An example structure is provided below. FIG. 1 illustrates a structure for a thermally-assisted magnetoresistive random access memory (TAS-MRAM) device 100 according to an embodiment. FIG. 1 depicts a cross-sectional view of the MRAM device 100.

The structure of the MRAM device 100 includes a substrate 15, a non-magnetic heating barrier structure 112, an antiferromagnetic layer 30 (such as, e.g., IrMn, FeMn, PtMn, etc.), a ferromagnetic storage layer 4, a non-magnetic active tunnel barrier 5, and a ferromagnetic sense layer 6 utilized to read out the MRAM device 100. The non-magnetic heating barrier structure 112 includes a buffer layer 101 such as, e.g., TaN, and Ta; a barrier seed layer 102 such as, e.g., CoFeB; a non-magnetic (insulating) tunnel barrier layer 103 such as, e.g., MgO, AlO, and other oxides; a barrier cap layer 104 such as, e.g., CoFeB, CoFe, NiFe, and various alloys including B and other inert elements; and a top buffer layer 105 such as, e.g., TaN, Ta, and other nitrides.

It can be appreciated that each of these "functional" layers in the non-magnetic heating barrier structure 112 may consist of multiple physical sublayers, alloys, and/or other combinations of materials, that together still fall under the scope of this structure.

By having the second insulating tunnel barrier 103, the voltage of voltage source 70 is split between the "active" tunnel barrier 5 (which has TMR necessary to read out the MRAM device 100) and the "heating-only" tunnel barrier 103, which functions primarily as a resistor with no TMR. By splitting the voltage of the voltage source 70, the load on each barrier 5 and 103 is reduced and therefore the breakdown voltage of the entire stack (MRAM device 100) is increased. However, as long as the TMR of the active barrier 5 is sufficiently large, the MRAM device 100 as a whole has enough TMR to be useful in a practical circuit. Typically, at least 20% TMR is necessary for the active barrier 5, such that when the resistance change is diluted by the presence of the heating-only resistive barrier 112, the total TMR of the MRAM device will be at least 10%, assuming the active 5 and heating-only 103 barriers are of comparable thickness and resistance, which is typically the case. With only the first non-magnetic active tunnel barrier 5, the breakdown voltage of the MRAM device 100 may be only 0.9 V (volts) or less for a typical active barrier 5 of approximately 12 Angstroms (Å) thickness (1.2 nanometers (nm). However, with both the first non-magnetic active tunnel barrier 5 and the second non-magnetic tunnel barrier 103, the breakdown voltage may be 1.5 V or more for an active barrier 5 of thickness 12 Å (1.2 nm) and a heating-only barrier 103 of thickness 13 Å (1.3 nm). These barrier thicknesses are examples only; they can be independently tuned to provide the optimal trade-off between signal and breakdown voltage. In addition, it can be appreciated by one skilled in the art that the exact resistance and breakdown voltage from a double barrier stack may not be a direct function of the tunnel barrier thicknesses, since interface effects, granularity, electronic structure of the barrier and surrounding metals, thermal environment, and other factors contribute differently to the active 5 and heating-only 103 tunnel barrier resistance and breakdown voltage.

FIG. 1 further shows a magnetic tunnel junction 10 which includes the ferromagnetic sense layer 6 disposed on the non-magnetic active tunnel barrier 5. The magnetic tunnel junction 10 also includes the non-magnetic active tunnel barrier 5 disposed on the ferromagnetic storage layer 4. The non-magnetic active tunnel barrier 5 (as well as the non-magnetic tunnel barrier 103) may be a semiconductor or insulator with a high resistance. The non-magnetic active tunnel barrier 5 includes MgO. The tunnel barrier 5 is termed active because the sense and storage layers are of the correct thickness, composition, and interface to the tunnel barrier such that the tunneling magnetoresistance effect is present. The barrier 103 is termed "heating-only" because the layers 101, 102, 104, and 105 have thickness, composition, and interface structures such that the tunnel barrier 103 forms with appropriate resistance but without any measurable tunneling magnetoresistance effect. That is, even though some of the materials used in layers 102 and 104 are known magnetic materials, their thickness, structure, and proximity to the non-magnetic buffer layers 101 and 105 prevent them from being magnetic, thus enabling a unique benefit of embodiments discussed herein.

For the ferromagnetic storage layer 4 and the ferromagnetic sense layer 6, the ferromagnetic materials include a Co, Fe, and/or Ni based alloy.

The ferromagnetic storage layer 4 is disposed on the antiferromagnetic (AF) pinning layer 30. The antiferromagnetic pinning layer 30 is an antiferromagnet and may include materials such as, e.g., IrMn, FeMn, PtMn, etc. The antiferromagnetic pinning layer 30 is composed of two magnetic sublattices. The two magnetic sublattices have opposite magnetic orientations (also referred to as magnetic moments), such that the net magnetic moment of the antiferromagnetic pinning layer 30 is zero. Since antiferromagnets have a small or no net magnetization, their spin orientation is only negligibly influenced by an externally applied magnetic field.

The antiferromagnetic pinning layer 30 is disposed on top of the non-magnetic heating barrier structure 112 as noted above. The non-magnetic heating barrier structure 112 is disposed on the substrate 15.

A contact structure 20 is disposed on top of the ferromagnetic sense layer 6 connecting the magnetic tunnel junction 10 (MRAM device 100) to a first wire 40. The contact structure 20 may also be refereed to as a non-magnetic cap.

The substrate 15 is disposed on top of a second wire 60. The wires 40 and 60 connect the MRAM device 100 to the voltage source 70 (for generating the write bias current to heat the MRAM device 100) and ammeter 75 for measuring current. As such, the resistance of the MTJ 10 (i.e., MRAM device 100) can be determined.

Further details regarding the non-magnetic heating barrier structure 112 are provided. The buffer layer 101 acts a diffusion layer and/or cap layer that blocks interactions between the layer 15 underneath with the layer 102 above the buffer layer 101. The buffer layer 101 may be deposited with a thickness between 5-50 Å, and in one implementation the buffer layer 101 may be 20 Å thick. The buffer layer 101 provides a smooth surface for depositing the barrier seed layer 102.

The barrier seed layer 102 is a layer designed to grow the (MgO) non-active tunnel barrier 103. The barrier seed layer 102 may be a few Angstroms (e.g., 3 to 15 Å) thick, and in one implementation the barrier seed layer 102 may be about 7 Å thick. The barrier seed layer 102 is an amorphous material, and once annealed, the barrier seed layer 102 follows the bcc<001> crystalline structure of the non-active tunnel barrier 103.

The non-active tunnel barrier 103 is a bcc <001> crystal structure resulting from a good seed (barrier seed layer 102)

and a high temperature anneal at temperatures of 250° Celsius or greater. The second non-magnetic tunnel barrier 103 heats the MRAM device 100 from the bottom when the electrical current (i) from the voltage source 70 is applied. The second non-magnetic tunnel barrier 103 has a thickness that may range from 10-30 Å, and the resistance area (RA) product of the second non-magnetic tunnel barrier 103 may range from 4-50 Ω·μm².

The barrier cap layer 104 protects the second non-magnetic tunnel barrier 103 from the top and prevents interactions from layers above. The barrier cap layer 104 has a thickness that may range from about 3-15 Å, and in one implementation the barrier cap layer 104 is about 7 Å thick.

The top buffer layer 105 is a cap to prevent interactions from above layers from interfering with layers 104 and 103 below. The top buffer layer 105 may have a thickness that ranges from 5-20 Å, and in one implementation the top buffer layer 105 is 10 Å thick.

An example of writing data to the MRAM device 100 is discussed below. It can be appreciated that other methods to write data into this memory device exist and can be applied.

A write current (i) (from voltage source 70) is passed vertically through the MRAM device 100 to heat the MRAM device 100 to $T_{write}$ which depins the ferromagnetic storage layer 4 from the antiferromagnetic pinning layer 30.

A write field is applied via a field line 80 to the MRAM device 100 in order to reorient the magnetization direction of the ferromagnetic storage layer 4 to the desired direction for writing a logic "1" or logic "0". The field line 80 may be a magnetic generating device 80 that is a combination of an (insulated) metal wire connected to a voltage source to generate the magnetic field as understood by one skilled in the art. Also, the magnetic generating device 80 may be a CMOS (complementary metal oxide semiconductor) circuit that generates the magnetic field as understood by one skilled in the art.

The write current (i) is reduced back to zero (i.e., the voltage source 70 is turned off) and the MRAM device 100 cools in the write field, which reorients the antiferromagnet pinning layer 30 to pin the ferromagnetic storage layer 4 in the new direction (e.g., flip the magnetic orientation of the ferromagnetic storage layer 4 from left to right). The write field is reduced back to zero. Thus, the magnetic direction (e.g., shown with an arrow) of the ferromagnetic storage layer 4 has now been encoded with a logical "1" or "0".

An example of reading the encoded MRAM device 100 is provided below. It can be appreciated that other methods to read data from this memory device exist and can be applied.

1) A read field is applied (via the field line 80) to the MRAM device 100 in a first, known direction at any temperature.

2) The resistance of the MRAM device 100 is measured from top to bottom (via the voltage source 70 and current meter 75).

3) The read field is reduced back to zero (i.e., voltage to the field line 80 is turned off).

4) Next, a read field is applied (via the field line 80) to the MRAM device 100 in a second, known direction opposite to the first direction.

5) The resistance of the MRAM device 100 is again measured from top to bottom (via the voltage source 70 and current meter 75).

6) The read field is reduced back to zero.

7) Based on the above operations, the magnetic direction of the ferromagnetic storage layer 4 is determined form the sign of the resistance change between operation 3 and operation 6.

8) The direction of the ferromagnetic storage layer 4 encodes a logical "1" or "0".

Figure 2:
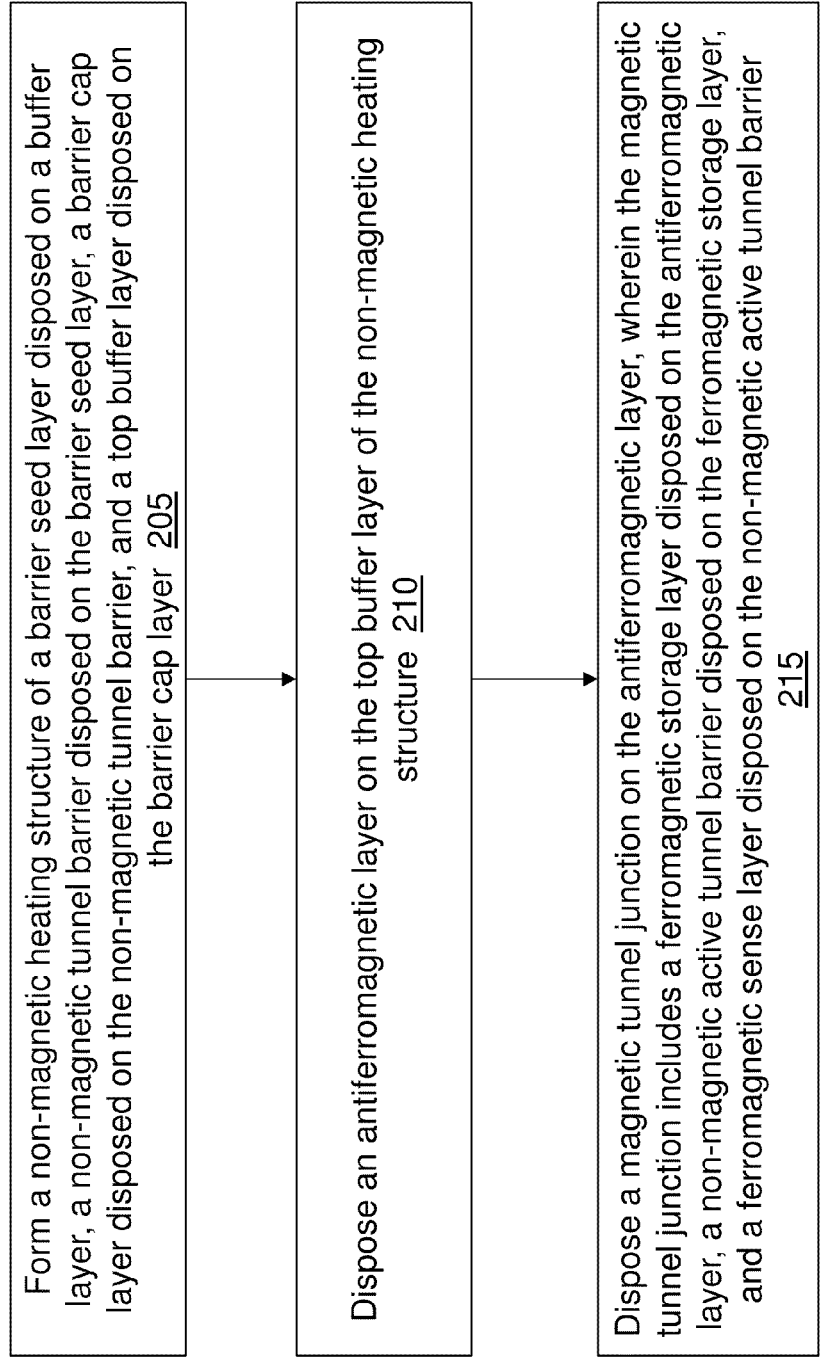
FIG. 2 illustrates a method of forming the thermally assisted magnetoresistive random access memory with device with a double tunnel barrier according to an embodiment.

Now turning to FIG. 2, a method 200 of forming the thermally assisted magnetoresistive random access memory device (TAS-MRAM) 100 is provided.

At block 205, the non-magnetic heating structure 112 is formed of the barrier seed layer 102 disposed on the buffer layer 101, the non-magnetic tunnel barrier 103 disposed on the barrier seed layer 102, the barrier cap layer 104 disposed on the non-magnetic tunnel barrier 103, and the top buffer layer 105 disposed on the barrier cap layer 104.

The antiferromagnetic layer 30 is disposed on the top buffer layer 105 of the non-magnetic heating structure 112 at block 210.

At block 215, the magnetic tunnel junction 10 is disposed on the antiferromagnetic layer 30, and the magnetic tunnel junction 10 includes the ferromagnetic storage layer 4 disposed on the antiferromagnetic layer 30, the non-magnetic active tunnel barrier 5 disposed on the ferromagnetic storage layer 4, and the ferromagnetic sense layer 6 disposed on the non-magnetic active tunnel barrier 5.

The non-magnetic tunnel barrier 103 in the non-magnetic heating structure 112 and the non-magnetic active tunnel barrier 5 in the magnetic tunnel junction 10 both generate heat when the write current (i) is applied via the voltage source 70.

The non-magnetic tunnel barrier 103 and the non-magnetic active tunnel barrier 5 share the (majority of) voltage applied by the voltage source 70 across layers 20, 6, 5, 4, 30, 105, 104, 103, 102, 101, and 15, as barriers 5 and 103 have the highest resistance in the MRAM device 100. A combination of the non-magnetic tunnel barrier 103 and the non-magnetic active tunnel barrier 5 increase breakdown voltage.

The non-magnetic active tunnel barrier 5 is the first resistive heating element and the non-magnetic tunnel barrier 103 is the second resistive heating element. The non-magnetic active tunnel barrier 5 and the non-magnetic tunnel barrier 103 together generate more heat to the antiferromagnetic layer 30 and the ferromagnetic storage layer 4, than either the non-magnetic active tunnel barrier 5 or the non-magnetic tunnel barrier 103 alone can generate.

The barrier seed layer 102 has a thickness ranging from about 3 to 15 Angstroms, the bottom buffer layer 101 has a thickness ranging from about 5 to 50 Angstroms, and the non-magnetic tunnel barrier 103 has a thickness ranging from about 10 to 30 Angstroms.

The barrier cap layer 104 has a thickness ranging from about 3 to 15 Angstroms, and the top buffer layer 105 has a thickness ranging from about 5 to 20 Angstroms.

Figure 3:
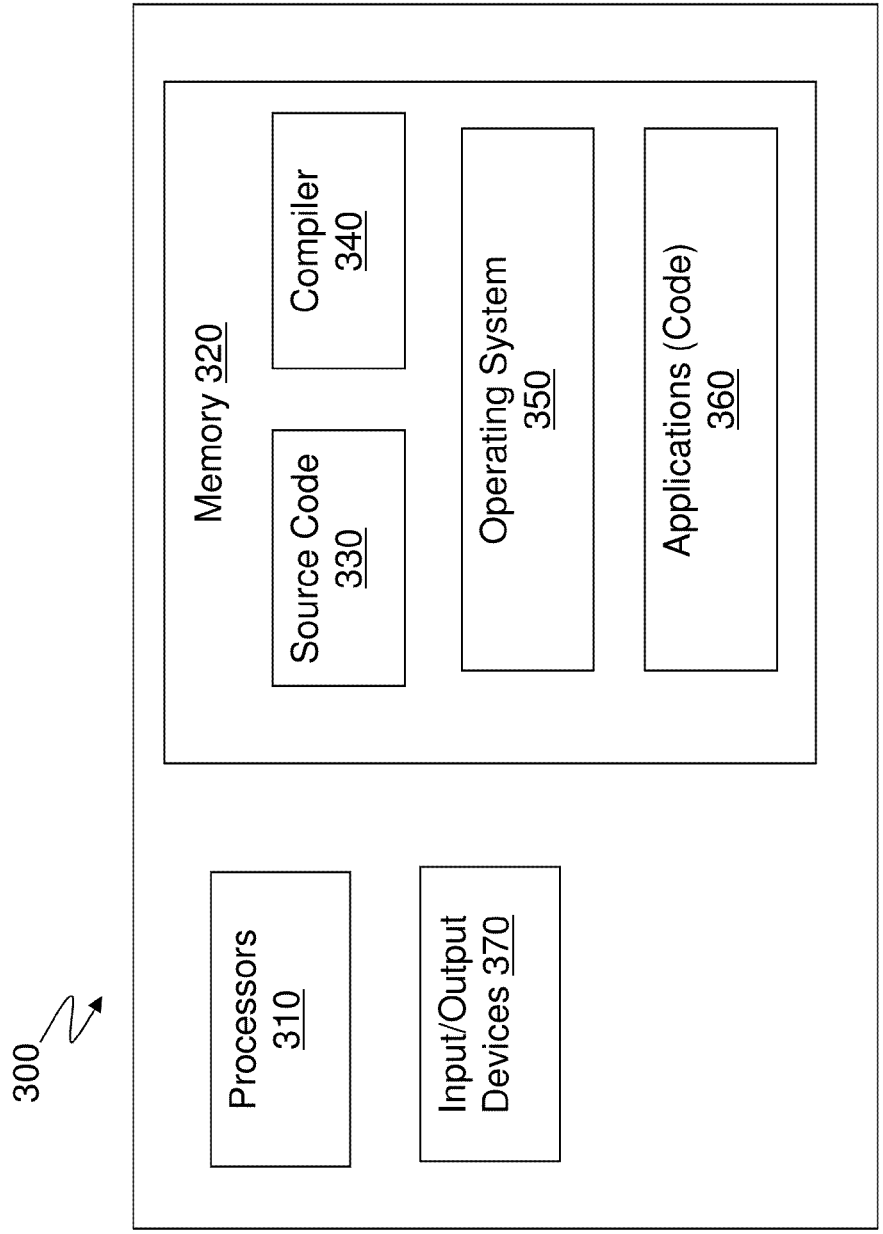
FIG. 3 illustrates an example of a computer which can be connected to, operate, and/or include the MRAM device(s) according to an embodiment.

FIG. 3 illustrates an example of a computer 300 which includes the MRAM device 100. The computer 300 has capabilities that may be included in exemplary embodiments. The MRAM device 100 may be constructed in a memory array, e.g., multiple MRAM devices 100 connected together as understood by one skilled in the art (for reading and writing data), and the memory array may be part of the computer memory 320 discussed herein. Various methods, procedures, circuits, elements, and techniques discussed herein may also incorporate and/or utilize the capabilities of the computer 300. One or more of the capabilities of the computer 300 may be utilized to implement, to incorporate, to connect to, and/or to support any element discussed herein (as understood by one skilled in the art) in FIGS. 1 and 2.

Generally, in terms of hardware architecture, the computer 300 may include one or more processors 310, computer readable storage memory 320, and one or more input and/or output (I/O) devices 370 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 310 is a hardware device for executing software that can be stored in the memory 320. The processor 310 can be virtually any custom made or commercially available processor, a central processing unit (CPU), a data signal processor (DSP), or an auxiliary processor among several processors associated with the computer 300, and the processor 310 may be a semiconductor based microprocessor (in the form of a microchip) or a microprocessor.

The computer readable memory 320 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 320 may incorporate electronic, magnetic, optical, and/or other types of storage media. Note that the memory 320 can have a distributed architecture, where various components are situated remote from one another, but can be accessed by the processor 310.

The software in the computer readable memory 320 may include one or more separate programs, each of which comprises an ordered listing of executable instructions for implementing logical functions. The software in the memory 320 includes a suitable operating system (0/S) 350, compiler 340, source code 330, and one or more applications 360 of the exemplary embodiments. As illustrated, the application 360 comprises numerous functional components for implementing the features, processes, methods, functions, and operations of the exemplary embodiments. The application 360 of the computer 300 may represent numerous applications, agents, software components, modules, interfaces, controllers, etc., as discussed herein but the application 360 is not meant to be a limitation.

The operating system 350 may control the execution of other computer programs, and provides scheduling, input-output control, file and data management, memory management, and communication control and related services.

The application 360 may be a source program, executable program (object code), script, or any other entity comprising a set of instructions to be performed. When a source program, then the program is usually translated via a compiler (such as the compiler 340), assembler, interpreter, or the like, which may or may not be included within the memory 320, so as to operate properly in connection with the O/S 350. Furthermore, the application 360 can be written as (a) an object oriented programming language, which has classes of data and methods, or (b) a procedure programming language, which has routines, subroutines, and/or functions.

The I/O devices 370 may include input devices (or peripherals) such as, for example but not limited to, a mouse, keyboard, scanner, microphone, camera, etc. Furthermore, the I/O devices 370 may also include output devices (or peripherals), for example but not limited to, a printer, display, etc. Finally, the I/O devices 370 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 370 also include components for communicating over various networks, such as the Internet or an intranet. The I/O devices 370 may be connected to and/or communicate with the processor 310 utilizing Bluetooth connections and cables (via, e.g., Universal Serial Bus (USB) ports, serial ports, parallel ports, FireWire, HDMI (High-Definition Multimedia Interface), etc.).

When the computer 300 is in operation, the processor 310 is configured to execute software stored within the memory 320, to communicate data to and from the memory 320, and to generally control operations of the computer 300 pursuant to the software. The application 360 and the O/S 350 are read, in whole or in part, by the processor 310, perhaps buffered within the processor 310, and then executed.

When the application 360 is implemented in software it should be noted that the application 360 can be stored on virtually any computer readable storage medium for use by or in connection with any computer related system or method.

The application 360 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 360 is implemented in hardware, the application 360 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A thermally assisted magnetoresistive random access memory device (TAS-MRAM) comprising:
   a non-magnetic heating structure, wherein the non-magnetic heating structure is formed of a barrier seed layer disposed directly on a buffer layer, a non-magnetic tunnel barrier disposed directly on the barrier seed layer, a barrier cap layer disposed directly on the non-magnetic tunnel barrier, and a top buffer layer disposed directly on the barrier cap layer;

an antiferromagnetic layer disposed directly on the top buffer layer of the non-magnetic heating structure; and a magnetic tunnel junction disposed directly on the antiferromagnetic layer, wherein the magnetic tunnel junction includes a ferromagnetic storage layer disposed directly on the antiferromagnetic layer, a non-magnetic active tunnel barrier disposed directly on the ferromagnetic storage layer, and a ferromagnetic sense layer disposed directly on the non-magnetic active tunnel barrier.

2. The device of claim 1, wherein the non-magnetic tunnel barrier in the non-magnetic heating structure and the non-magnetic active tunnel barrier in the magnetic tunnel junction both generate heat.

3. The device of claim 1, wherein the non-magnetic tunnel barrier and the non-magnetic active tunnel barrier share voltage applied across layers.

4. The device of claim 1, wherein a combination of the non-magnetic tunnel barrier and the non-magnetic active tunnel barrier increase breakdown voltage.

5. The device of claim 1, wherein the non-magnetic active tunnel barrier is a first resistive heating element and the non-magnetic tunnel barrier is a second resistive heating element.

6. The device of claim 5, wherein the non-magnetic active tunnel barrier and the non-magnetic tunnel barrier together generate more heat to the antiferromagnetic layer and the ferromagnetic storage layer, than either the non-magnetic active tunnel barrier or the non-magnetic tunnel barrier alone.

7. The device of claim 1, wherein the barrier seed layer has a thickness ranging from about 3 to 15 Angstroms.

8. The device of claim 1, wherein the buffer layer has a thickness ranging from about 5 to 50 Angstroms.

9. The device of claim 1, wherein the non-magnetic tunnel barrier has a thickness ranging from about 10 to 30 Angstroms.

10. The device of claim 1, wherein the barrier cap layer has a thickness ranging from about 3 to 15 Angstroms; and
wherein the top buffer layer has a thickness ranging from about 5 to 20 Angstroms.

11. A method of forming a thermally assisted magnetoresistive random access memory device (TAS-MRAM), the method comprising:

forming a non-magnetic heating structure, wherein the non-magnetic heating structure is formed of a barrier seed layer disposed directly on a buffer layer, a non-magnetic tunnel barrier disposed directly on the barrier seed layer, a barrier cap layer disposed directly on the non-magnetic tunnel barrier, and a top buffer layer disposed directly on the barrier cap layer;

disposing an antiferromagnetic layer directly on the top buffer layer of the non-magnetic heating structure; and disposing a magnetic tunnel junction directly on the antiferromagnetic layer, wherein the magnetic tunnel junction includes a ferromagnetic storage layer disposed directly on the antiferromagnetic layer, a non-magnetic active tunnel barrier disposed directly on the ferromagnetic storage layer, and a ferromagnetic sense layer disposed directly on the non-magnetic active tunnel barrier.

12. The method of claim 11, wherein the non-magnetic tunnel barrier in the non-magnetic heating structure and the non-magnetic active tunnel barrier in the magnetic tunnel junction both generate heat.

13. The method of claim 11, wherein the non-magnetic tunnel barrier and the non-magnetic active tunnel barrier share voltage applied across layers.

14. The method of claim 11, wherein a combination of the non-magnetic tunnel barrier and the non-magnetic active tunnel barrier increase breakdown voltage.

15. The method of claim 11, wherein the non-magnetic active tunnel barrier is a first resistive heating element and the non-magnetic tunnel barrier is a second resistive heating element.

16. The method of claim 15, wherein the non-magnetic active tunnel barrier and the non-magnetic tunnel barrier together generate more heat to the antiferromagnetic layer and the ferromagnetic storage layer, than either the non-magnetic active tunnel barrier or the non-magnetic tunnel barrier alone.

17. The method of claim 11, wherein the barrier seed layer has a thickness ranging from about 3 to 15 Angstroms.

18. The method of claim 11, wherein the buffer layer has a thickness ranging from about 5 to 50 Angstroms.

19. The method of claim 11, wherein the non-magnetic tunnel barrier has a thickness ranging from about 10 to 30 Angstroms.

20. The method of claim 11, wherein the barrier cap layer has a thickness ranging from about 3 to 15 Angstroms; and
wherein the top buffer layer has a thickness ranging from about 5 to 20 Angstroms.

* * * * *